(12) United States Patent
Outaleb et al.

(10) Patent No.: US 7,573,330 B2
(45) Date of Patent: Aug. 11, 2009

(54) HIGH EFFICIENCY DIGITAL POWER AMPLIFIER

(75) Inventors: Noureddine Outaleb, Ottawa (CA); Adrian Bergsma, Kanata (CA); John Ilowski, Nepean (CA)

(73) Assignee: Nortel Networks Limited, St. Laurent, Quebec (CA)

(*) Notice: Subject to any disclaimer, the term of this patent is extended or adjusted under 35 U.S.C. 154(b) by 0 days.

(21) Appl. No.: 11/981,780

(22) Filed: Oct. 30, 2007

(65) Prior Publication Data

US 2008/0129382 A1    Jun. 5, 2008

Related U.S. Application Data

(60) Provisional application No. 60/863,412, filed on Oct. 30, 2006.

(51) Int. Cl.
*H03F 3/217* (2006.01)
(52) U.S. Cl. .................................. 330/251; 330/207 A
(58) Field of Classification Search .................. 330/251, 330/207 A, 10
See application file for complete search history.

(56) References Cited

U.S. PATENT DOCUMENTS

| | | | |
|---|---|---|---|
| 5,023,566 A | | 6/1991 | El-Hamamsy et al. |
| 5,903,188 A | * | 5/1999 | Swanson et al. ............ 330/10 |
| 7,116,168 B2 | * | 10/2006 | Makino et al. ............ 330/251 |
| 7,312,654 B2 | * | 12/2007 | Roeckner et al. ............ 330/10 |
| 7,456,685 B2 | * | 11/2008 | Chen ............................ 330/10 |
| 2005/0134372 A1 | | 6/2005 | Atmur |
| 2006/0006950 A1 | | 1/2006 | Burns et al. |

OTHER PUBLICATIONS

International Search Report issued by the European Patent Office on Jun. 20, 2008 in International Application No. PCT/US2007/023022.
Written Opinion of the International Searching Authority issued by the European Patent Office on Jun. 20, 2008 in International Application No. PCT/US2007/023022.

* cited by examiner

*Primary Examiner*—Henry K Choe
(74) *Attorney, Agent, or Firm*—Robert D. McCutcheon

(57) ABSTRACT

A digital power amplifier (or power switching amplifier or power switch) for use in a digital transmitter includes a low impedance multi-stage driver circuit having a low impedance pre-driver and a low impedance driver. The drive circuit drives a power switch stage having two power transistors configured in a current mode class-D push-pull configuration. Utilization of gallium nitride (GaN) transistors or pseudomorphic high electronic mobility transistors (pHEMT) (or combination thereof) and sizing the transistors progressively larger in the driver than in the pre-driver (at least about 3×) provides a reduction in output impedance of the driver circuit and progressive increases in the power driving capability of the succeeding stage. This allows the use of a power amplifier at higher frequencies without altering or affecting the power efficiency and allows use of a digital power amplifier for a digital transmitter.

18 Claims, 4 Drawing Sheets

HIGH EFFICIENCY DIGITAL POWER AMPLIFIER

CROSS-REFERENCE TO RELATED APPLICATION

This application claims priority under 35 USC 119(e) to U.S. provisional Application Ser. No. 60/863,412, filed on Oct. 30, 2006, and which is incorporated herein by reference.

TECHNICAL FIELD

The present invention relates to digital transmitters, in particular, to a digital power amplifier (switching mode power amplifier) within a digital transmitter for use in communications.

BACKGROUND

Use of digital power amplifiers (DPAs) is desirable in transceiver systems (for use in wireless mobile terminals/stations and base stations) within a communication system to enhance efficiency, reduce costs and reduce size. DPAs typically include two stages—a driver stage and an output stage. The output stage is based on switch mode power amplifiers—an architecture that requires high speed devices.

The driver stage receives a pulsed digital signal which represents the modulated/coded signal. Such modulated/coded signals may be generated in accordance with any format, standard or specification, such as Global System for Mobile (GSM), Code Division Multiple Access (CDMA), Universal Mobile Telecommunication System (UMTS), Worldwide Interoperability for Microwave Access (WiMAX), and the like, as well as others known to those skilled in the art.

A typical digital power amplifier output stage includes a power switch transistor driven by the pulsed waveform output from the driver stage. As frequency of operation increases, the amplifier's efficiency and response is affected. Switching speed of the power transistor (within the output stage) is limited by parasitic capacitances (gate-source capacitance, gate-drain capacitance and drain-source capacitance). These capacitances are generally proportional to the size of the transistor. Higher power transistors require larger dimensions, which fundamentally increases capacitance which also reduces efficiency at higher frequencies. As a result, for high power, high frequency DPAs, it is desirable to utilize transistors with a high power density and low parasitic capacitances (to decrease the charging/discharging time constant resulting from gate capacitances) as well as losses through output capacitance (drain-source capacitance).

Though driving power depends on switching frequency, it is independent of source impedance. However, the switching speed of the power transistor (within the output stage) is limited by its source impedance (i.e., the output impedance of the driver). As a result, output impedance of the driver stage becomes a crucial design parameter to consider when attempting to optimize the overall transmitter system efficiency. Various prior art attempts to increase efficiency, such as those involving 50 ohm impedance drivers, adversely affect the switching speed and power efficiency when power transistors are driven by pulsed digital signals.

Accordingly, there is a need for a digital power amplifier that includes a low output impedance driver to allow increased frequency operation and efficiency.

SUMMARY

According to the present invention, there is provided a digital power amplifier having a pre-driver adapted to receive a digital modulated signal and generate a pre-drive signal and a driver coupled to the pre-driver and adapted to receive the pre-drive signal and generate a drive signal. A power amplifier is coupled to the driver and has at least one power transistor adapted to receive the drive signal and generate a power amplified digital signal for RF transmission via an antenna. The pre-driver, driver and power amplifier operate collectively to amplify the digital modulated signal.

In another embodiment of the invention, there is provided a digital power amplifier including a differential amplifier having two input terminals for receiving a first low voltage digital modulated signal and a second low voltage digital modulated signal and having two output terminals for outputting a first differential amplified digital modulated signal and a second differential amplified digital modulated signal. The digital power amplifier further includes a low impedance pre-driver circuit having two input terminals coupled to the two differential amplifier output terminals and having four output terminals for outputting a first pre-driver output signal, a second pre-driver output signal, a third pre-driver output signal and a fourth pre-driver output signal, and a low impedance driver having four input terminals respectively coupled to the four pre-driver output terminals and having two output terminals for outputting a first drive signal and a second drive signal. Also included is a power amplifier (output stage) including a first power transistor having a gate, a first source/drain and a second source/drain, the second source/drain coupled to a first voltage source VSS, and a second power transistor having a gate, a first source/drain and a second source/drain, the second source/drain coupled to the first voltage source VSS. A first inductive element is coupled a second voltage source VDD and coupled to the first source/drain of the first power transistor, and a second inductive element is coupled the second voltage source VDD and coupled to the first source/drain of the second power transistor. The first source/drain of the first power transistor outputs an amplified version of the first digital modulated signal and the second source/drain of the second power transistor outputs an amplified version of the second digital modulated signal.

In yet another embodiment, there is provided a wireless communications device including a digital transmitter and an antenna. The digital transmitter includes a digital upconverter adapted to generate a digital modulated signal and a digital power amplifier. The digital power amplifier has a pre-driver adapted to receive a digital modulated signal and generate a pre-drive signal, a driver coupled to the pre-driver and adapted to receive the pre-drive signal and generate a drive signal, and a power amplifier coupled to the driver and having at least one power transistor adapted to receive the drive signal and generate a power amplified digital signal for RF transmission. The pre-driver, driver and power amplifier collectively amplify the digital modulated signal.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

The present disclosure describes a switching power amplifier, also known as a digital power amplifier (DPA), for use in a transmitter within a wireless communication device in a communications system. The DPA includes two main stages—a driver stage and an output stage.

Numerous portions or aspects of the transmitter are omitted for brevity, and only those elements or devices necessary or relevant to an understanding of the present disclosure are described or shown herein. The DPA (or switching power amplifier) described herein may be used in different and various configurations of transmitters. Examples of one or more transmitters in which the described DPA may be utilized are illustrated and described in U.S. Pat. Nos. 6,987,953, 7,053,700 and 7,081,793, which are incorporated herein by reference.

Figure 1:
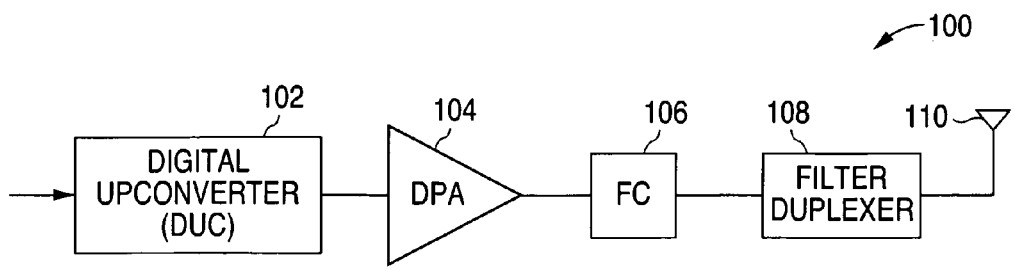
FIG. 1 is a block diagram of a portion of a digital transmitter in accordance with the present disclosure.

With reference to FIG. 1, there is shown the relevant portions of a digital transmitter 100 for use in conventional digital communications systems. The transmitter 100 includes a digital upconverter (DUC) 102 that outputs a pulsed digital signal (representing the modulated signal). As will be appreciated, descriptions of elements/components along the transmit path prior to the DUC 102, as well a specific description of the DUC 102, have been omitted. Person of ordinary skill in the art will recognize that these elements of the transmitter 100 may be implemented using different structures and/or methods. It will be understood that the modulation and/or coding scheme utilized in the transmitter 100 is not limited to any specific scheme, standard or specification.

The pulsed digital output of the digital upconverter 102 is shown differentially including a first pulsed digital signal and a second pulsed digital signal. The second pulsed digital signal is 180 degrees out of phase with the first signal. It will be understood that the structure and/or method for generating the out of phase signal along the transmit signal path has been omitted (those of ordinary skill in the art will be able to implement this).

The output of the digital upconverter 102 is input to a digital power amplifier (DPA) 104. In general terms, the DPA 104 amplifies and increases the power of the digital pulse signals for RF transmission. The power amplified signal(s) are input to a filter-combiner (FC) 106 for filtering and combining and input to a filter-duplexer 108 for transmission to an antenna 110.

As described above, the design and implementation of the DPA 104 is important to the overall efficiency of the transmitter 100. Various factors affect the efficiency of the DPA 104, including parasitic reactance, transition time, turn on resistance of transistor(s), transistor size (i.e., gate capacitance, drain-source capacitance), source impedance and frequency of operation. In order to increase the efficiency at a given frequency of operation (or minimize reduction in efficiency at higher frequencies), the present disclosure describes a driving stage having low output impedance at high frequencies and an output stage capable of providing high frequency of operation. Some of these benefits are accomplished by utilizing multi-stage drivers and/or a current mode class-D push-pull output stage having specified power switch transistors.

The transmitter 100 of FIG. 1 is illustrated as including a signal DPA 104 for a single phase. However, different transmitter architectures may utilize multiple DPAs for multiple digital signals (i.e., multiple phases). For example, the transmitter described in U.S. Pat. Nos. 7,053,700 and 7,081,793 include multiple switching power amplifiers or DPAs (one for each phase).

Figure 2:
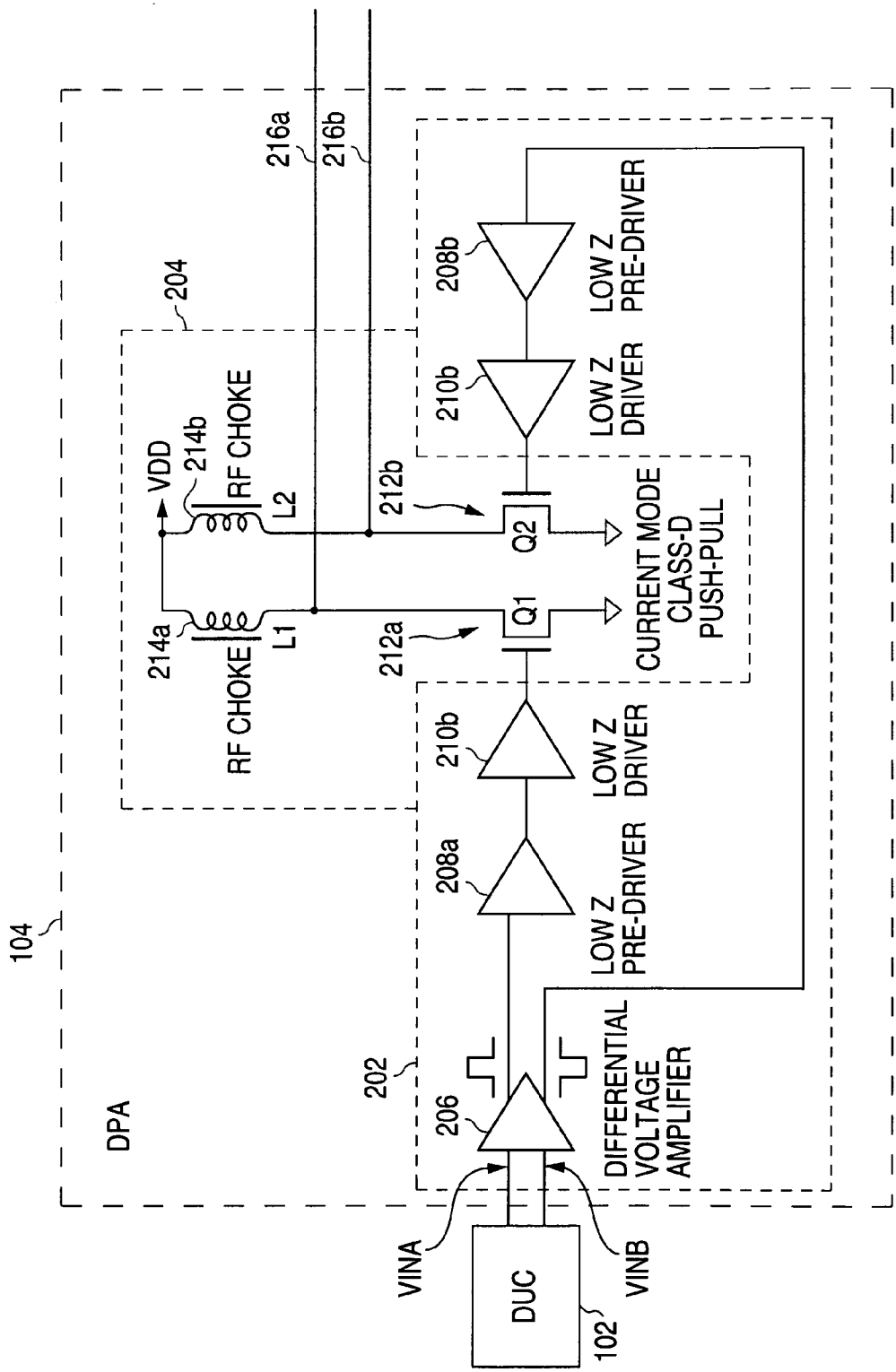
FIG. 2 is a block diagram of a digital switching power amplifier of the transmitter shown in FIG. 1.

Now referring to FIG. 2, there is shown a block diagram of the DPA (or switching power amplifier) 104. The DPA 104 includes a driving stage 202 and an output stage 204. As shown, the driving stage 202 includes a differential amplifier 206, two pre-drivers 208a, 208b (one for each differential signal) and two drivers 210a, 210b (one for each differential signal). The output stage 204 includes two power transistors (transistor Q1—also identified by reference numeral 212a; and transistor Q2—also identified by reference numeral 212b) (one for each differential signal) in a current mode class-D push-pull configuration with an RF choke 214a, 214a having two inductive elements L1 and L2. It will be understood that the output stage 204 may be constructed or implemented in a configuration other than that shown and described herein, however, this configuration may provide some benefits over other configurations at higher frequencies.

Figure 3:
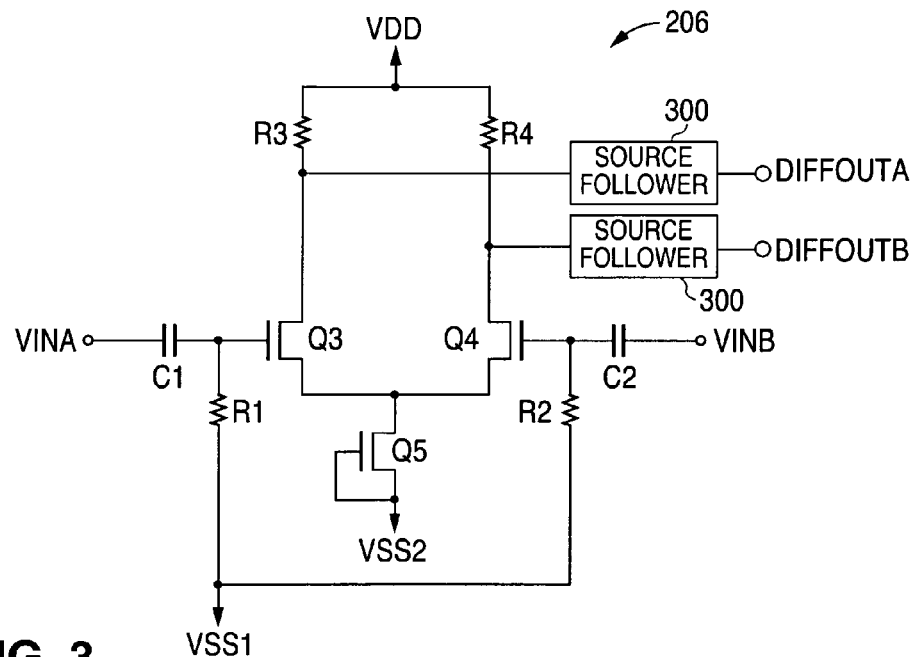
FIG. 3 is a schematic diagram of a differential amplifier in the driver stage shown in FIG. 2.

Now referring to FIG. 3, there is shown a schematic diagram of one embodiment of the differential amplifier 206 shown in FIG. 2. The amplifier 206 receives input signals VINA and VINB from the DUC 102. As will be appreciated, these signals are the digital upconverted signals from the DUC including the modulated information.

Signals VINA and VINB are input (through capacitors C1 and C2) to the gates of transistors Q3 and Q4, respectively, as shown. The gates of Q3 and Q4 are shunted to a voltage source VSS1 using resistors R1 and R2, respectively. The values of resistors R1 and R2 are selected to match or otherwise correspond with the value(s) of the source impedance of the circuit(s) generating signals VINA and VINB. The sources of transistors Q3 and Q4 are coupled to the drain of transistor Q5, which has its source coupled to its own gate and to a voltage source VSS2, as shown. The drains of transistors Q3 and Q4 are coupled through resistors R2 and R4, respectively, to a voltage source VDD.

In general terms, the differential amplifier 206 receives differential digital signals VINA and VINB, amplifies them, and outputs differential output signals DIFFOUTA and DIFFOUTB. It will be understood that the differential amplifier 206 also includes two source followers 300, as shown. The source followers 300 effectively lower the output impedance of the differential amplifier stage 206 (transform the high output impedance to a low output impedance). The two source followers 300 are also utilized to adjust output voltage levels (level shift).

Utilization of the differential amplifier stage 206 is beneficial when the voltage levels of VINA and VINB are relatively low, such as described hereinafter. This stage is used to amplify the voltage levels to a level sufficient to switch on and off the transistors in the pre-driver 208, thus, the type and sizes of transistors in the pre-driver 208 and the voltage level of the input signals VINA and VINB will likely determine whether a differential amplifier stage 206 is needed. For example, if the voltage swing of VINA and VINB is 0.6 volts peak-peak, then the resulting differential voltage level of 1.2 volts needs to be adequate to drive the switching of the pre-drivers. In most cases, this level would be insufficient to drive most transistors utilized in the pre-driver 208.

In another embodiment, not shown, the differential amplifier stage 206 may be omitted provided the signals VINA and VINB are sufficient or adequate to drive the pre-driver 208 (turn on and off its input transistors).

In one specific embodiment, the signals VINA and VINB each have a 0.6 voltage swing (e.g., between about 2.7 volts and 3.3 volts), resistors R1 and R2 are 50 ohms, resistors R2 and R4 are 350 ohms, the voltages VDD, VSS1 and VSS2 are +1 volt, −7 volts, and −8 volts, respectively, and the gate areas of transistors Q3, Q4 and Q5 are on the order of 100 micrometers ($um^2$). The gate areas of the transistors in the source followers 300 may be on the order of 200-300 micrometers ($um^2$).

Other values for the circuit elements and voltage sources may be used, depending on the particular application of the DPA 104 and the voltage level (or voltage swing level) necessary to switch the transistors between an on and off state in the pre-driver stage.

It will be understood that any suitable transistors may be utilized for transistors Q3, Q4 and Q5 to implement the differential amplifier having the characteristics and functionality as contemplated and described herein. In one embodiment, transistors Q3, Q4 and Q5 are gallium nitride (GaN), pseudomorphic high electronic mobility transistors (pHEMT), or a combination of these. Other types of transistors may be used. The transistors in the source followers 300 may also be as described above.

Figure 4:
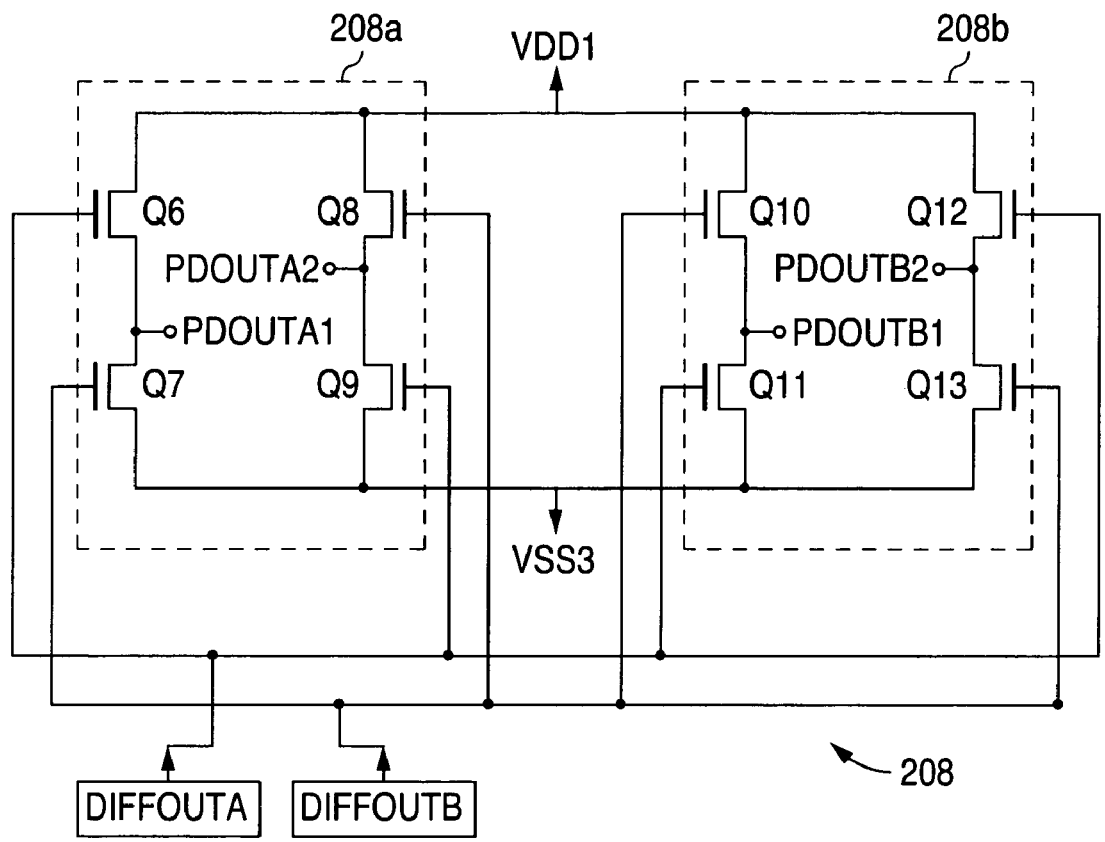
FIG. 4 is a schematic diagram of a pre-driver circuit in the driver stage shown in FIG. 2.

Now referring to FIG. 4, there is shown a schematic diagram of one embodiment of the pre-driver 208 shown in FIG. 2. The pre-driver 208 includes a first pre-driver 208a and a second pre-driver 208b, as shown. The pre-driver 208 receives the signals DIFFOUTA and DIFFOUTB output from the differential amplifier 206 as inputs.

The pre-driver circuit 208a includes a first pair of transistors Q6 and Q7 (series coupled) between a voltage source VDD1 and a voltage source VSS3 and a second similar pair of transistors Q8 and Q9 (series coupled) between the voltage sources VDD1 and VSS3, as shown. Similarly, the pre-driver circuit 208b includes a first pair of transistors Q10 and Q11 (series coupled) between the voltage sources VDD1 and a second similar pair of transistors Q12 and Q13 (series coupled) between the voltage sources VDD1 and VSS3, as shown.

The output differential signal DIFFOUTA from the differential amplifier 206 is input to the gates of transistors Q6, Q9, Q11 and Q12. The output differential signal DIFFOUTB from the differential amplifier 206 is input to the gates of transistors Q7, Q8, Q10 and Q13.

In general terms, the pre-driver circuit 208 receives amplified differential output signals DIFFOUTA and DIFFOUTB and provides complementary switching, level shifts the signals for input to the driver stage 210 (to drive those transistors, whether p-type or n-type) and also provides a low impedance output to the driver 210, and outputs four signals: PDOUTA1 (at the source/drain between transistors Q6 and Q7), PDOUTA2 (at the source/drain between transistors Q8 and Q9), PDOUTB1 (at the source/drain between transistors Q10 and Q11), and PDOUTB2 (at the source/drain between transistors Q12 and Q12). The pre-driver 208 is a current amplifier used to level shift the input signals sufficiently to drive (turn on/off) the transistors in the driver 210, and the configuration shown also provides a lower output impedance to the driver 210 (this reduces the typical 50 ohm output impedance of the DUC 102). The increase in size of the transistors (as compared to the diff amp transistors) increases or "steps up" the power driving (switching) capability to allow even larger transistors in the driver stage 210.

In one specific embodiment, the voltages VDD and VSS3 are +1 volts and −4 volts, respectively, and the gate areas of transistors Q6 through Q12 are on the order of 300 micrometer ($um^2$).

It will be understood that any suitable transistors may be utilized for transistors Q6 through Q12 to implement the pre-driver circuit 208 having the characteristics and functionality as contemplated and described herein. In one embodiment, transistors Q6-Q12 are gallium nitride (GaN), pseudomorphic high electronic mobility transistors (pHEMT), or a combination of these. Other types of transistors may be used.

Figure 5:
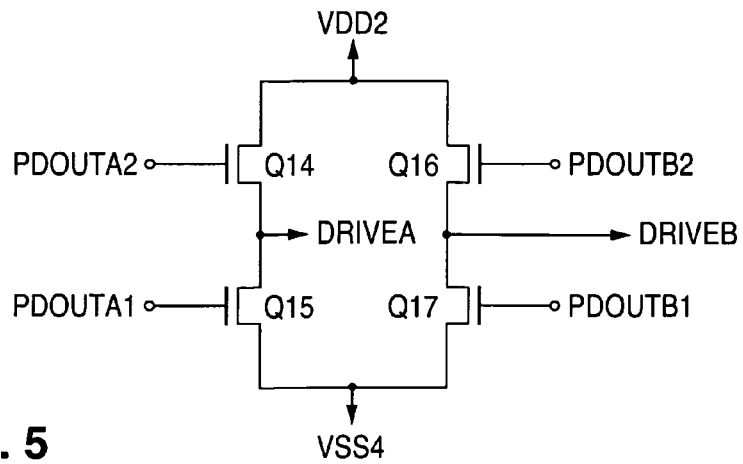
FIG. 5 is a schematic diagram of a driver circuit in the driver stage shown in FIG. 2.

Now turning to FIG. 5, there is shown a schematic diagram of one embodiment of the driver 210 shown in FIG. 2. The driver 208 includes a first driver 210a and a second driver 210b, as shown. The driver 210 receives the signals PDOUTA1, PDOUTA2, PDOUTB1 and PDOUTB2 from the pre-driver 208 as inputs.

The driver circuit 210a includes two transistors Q14 and Q15 (series coupled) between a voltage source VDD2 and a voltage source VSS4 and a second similar pair of transistors Q16 and Q17 (series coupled) between the voltage sources VDD2 and VSS4, as shown. The output signals PDOUTA1 and PDOUTA2 from the pre-driver 208a are input to the gates of transistors Q15 and Q14, respectively. Similarly, the output signals PDOUTB1 and PDOUTB2 from the pre-driver 208b are input to the gates of transistors Q17 and Q18, respectively.

In general terms, the driver circuit 210 receives the output signals PDOUTA1, PDOUTA2, PDOUTB1 and PDOUTB2 from the pre-driver 208 and performs similar or same functions as the pre-driver 208 by amplifying the previous stage output signals to provide higher power driving capability necessary to drive the transistors in the output stage 204, and outputs a DRIVEA signal and a DRIVEB signal The DRIVEA and DRIVEB signals drive the power transistors Q1 and Q2, respectively, in the output stage 204.

In one specific embodiment, the voltages VDD2 and VSS4 are +1 volts and −2 volts, respectively, and the gate areas of transistors Q13, Q14, Q15 and Q16 are on the order of 1 millimeter ($mm^2$).

It will be understood that any suitable transistors may be utilized for transistors Q13 through Q16 to implement the pre-driver circuit 208 having the characteristics and functionality as contemplated and described herein. In one embodiment, transistors Q13-Q16 are gallium nitride (GaN), pseudomorphic high electronic mobility transistors (pHEMT), or a combination of these. Other types of transistors may be used.

It will be appreciated that the topology or configuration of the pre-driver 208 and driver 210 provides current amplifiers with voltage switching.

Figure 6:
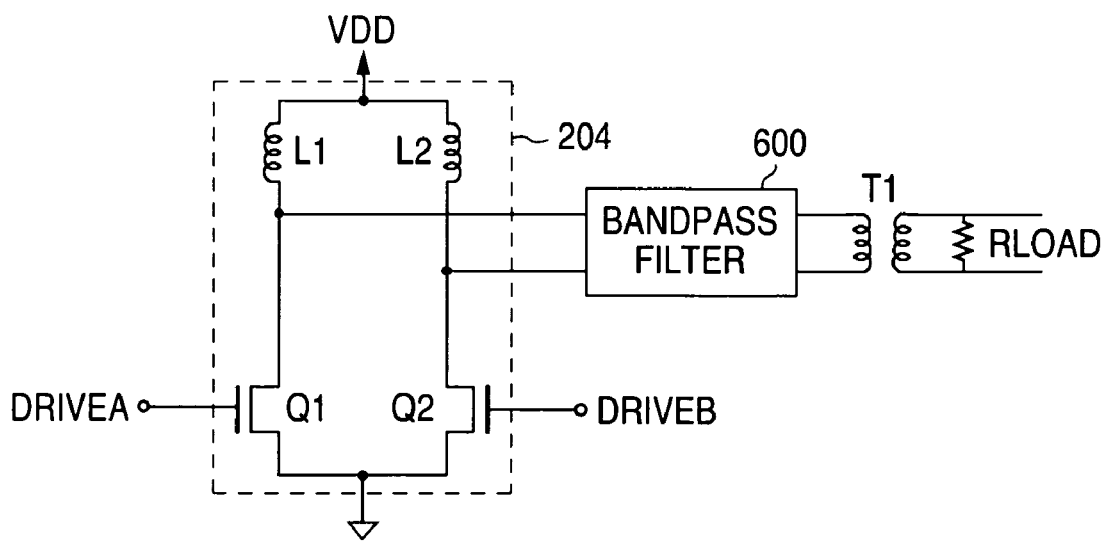
FIG. 6 is a schematic diagram of the output stage of the digital power amplifier shown in FIG. 2.

Now turning to FIG. 6, there is shown a schematic diagram of the output stage 204 shown in FIG. 2. The output stage 204 includes a first power transistor Q1, a second power transistor Q1, and two RF chokes L1 and L2, as shown. The RF choke element L1 is coupled to VDD and the drain of power transistor Q1 which has its source coupled to ground. Similarly, the RF choke L2 is coupled to VDD and the drain of power transistor Q2 which has its source coupled to ground. The RF choke allows this topology to operate in current mode and forces the current to be constant (through the two legs). The output stage 204 receives the signals DRIVEA and DRIVEB from the driver 210 as inputs. The output stage 204 is configured as a current mode class-D push pull amplifier. The output signal DRIVEA from the driver 210a is input to the gate of transistor Q1, while the output signal DRIVEB from the driver 210b is input to the gate of transistor Q2.

The differential (push-pull) power amplified output signals are generated at the nodes between the RF choke L1, L2 and the drain of their respective power transistors Q1, Q2. In general terms, the output stage 204 power amplifies the DRIVEA and DRIVEB signals for RF transmission. The output signals are input to a bandpass filter 600. In one embodiment, the bandpass filter 300 is a 3rd order Butterworth having a sharp drop-off for noise. The filter 600 passes the fundamental RF frequency and affects the resulting voltage waveform (half-sine wave) of the output signal which helps enhance the efficiency of the system. Thus, the bandpass filter 600 may be considered a part of the output stage. The output of the bandpass filter is then transmitted conventionally.

In one specific embodiment, the voltage VDD coupled to the RF choke L1, L2 of output stage 204 is +15 volts, and the gate areas of power transistors Q1 and Q2 are on the order of 2 millimeter ($mm^2$).

It will be understood that any suitable transistors may be utilized for transistors Q1 and Q2 to implement the output stage 204 having the characteristics and functionality as contemplated and described herein. In one embodiment, transistors Q1 and Q2 are gallium nitride (GaN), pseudomorphic high electronic mobility transistors (pHEMT), or a combination of these. Other types of transistors may be used.

Utilization of a pre-driver 206 and driver 208 to drive the power output stage 204 (class-D power amplifier) provide a reduction or step-down in source impedance of the output stage 204. In other words, the driver stage 202 driving the power transistors Q1 and Q2 of the output stage 204 has a lower output impedance as compared to driver circuits used in typical or conventional digital transmitters. Thus, the topology of pre-driver 208 and driver 210 provide low output impedance to the output stage 204.

The configuration of the drive stage 202 enhances efficiency both through utilization of differential signals (and the differential amplifier 204) and utilization of a low output impedance driver (pre-driver 208 and driver 210). In addition, one embodiment utilizes GaN transistors pre-driver 208 and driver 210. Similarly, GaN transistors may be used in the differential amplifier 206. Other embodiments may utilize pHEMT transistors and/or a combination of GaN and pHEMT transistors. For low power applications, pHEMT transistors may be utilized, while high power applications may utilize GaN transistors.

In addition, for lower frequencies when the topology of the pre-driver and driver described herein are utilized, it may be possible to use LDMOS or depletion mode transistors.

The lower output impedance of the driving stage 202 may be achieved by utilizing different sized transistors. As will be appreciated, in one embodiment, the transistor sizes progressively increase from the differential amplifier 206 to the pre-driver 208 and to the driver 210 to provide progressively increasing power drive capability necessary to drive the next stage (having larger transistors). In the specific embodiment described, transistors Q3, Q4 and Q5 in the differential amplifier have gate areas on the order of 100 $um^2$, the transistors Q6 through Q12 in the pre-driver have gate areas on the order of 300 $um^2$, and the transistors Q14 through Q16 have gate areas on the order of 1 $mm^2$. In one embodiment, the output stage power transistors Q1 and Q2 have gate areas on the order of 2 $mm^2$. In the event source follower(s) 300 are utilized in the differential amplifier 206, these transistors may have gate areas on the order of 200-300 $um^2$. Thus, transistor sizes in the pre-driver 208 are about 3× or greater than the transistor sizes in the differential amplifier 206, while transistor sizes in the driver 210 are about 3× or greater than the transistor sizes in the pre-driver 208. Also, the power transistor sizes in the output stage 204 are about 2× or greater than the transistor sizes in the driver 210. This progressively increasing transistor sizing along the signal path (in the drive stage 202) provides increasing power driving capability, and also provides a low source impedance for the output stage 204. When utilizing dimensions and topology as described above, the output impedance of the driver 210 may be about 5 ohms or less.

Figure 7:
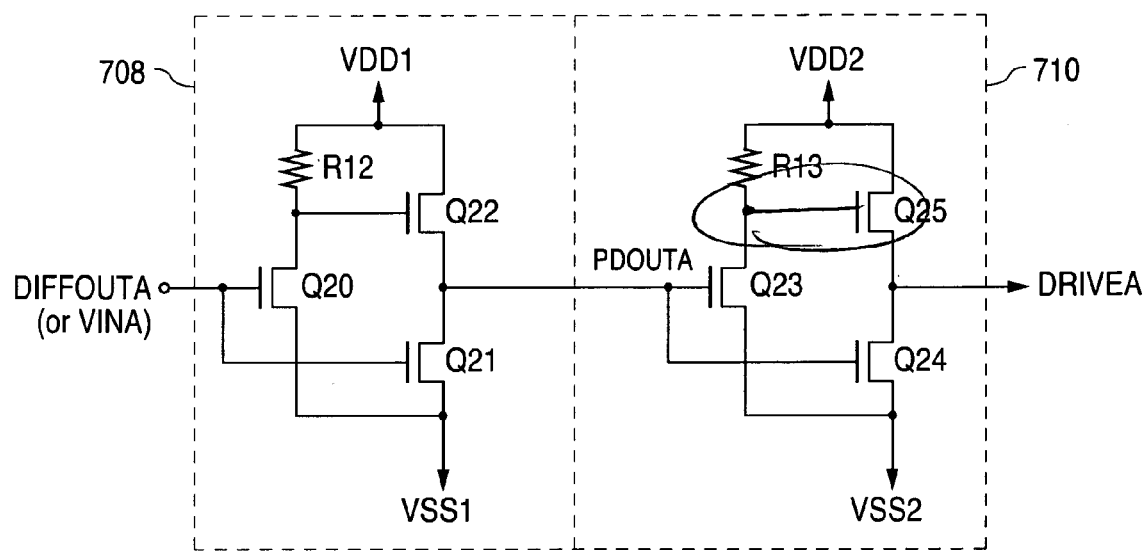
FIG. 7 is a schematic diagram of another embodiment of the pre-driver circuit and driver circuit.

Now turning to FIG. 7, there is shown a schematic diagram of an alternative embodiment of a pre-driver 708 and a driver 710. FIG. 7 illustrates the pre-driver and driver for one signal of a differential signal. As such, similar circuitry would be utilized for the other signal path.

The pre-driver 708 (only the signal A path is shown) may receive the signal DIFFOUTA output from the differential amplifier 206 as its input, or alternatively, the differential amplifier 206 may be omitted and the signal VINA may be the input signal (e.g., when the input signal voltage levels are sufficient to drive transistors in the pre-driver 708). Signal DIFFOUTA (or VINA) is input to the gates of transistors Q20 and Q21, as shown. The drain of transistor Q20 is coupled through resistor R12 to a voltage source VDD1 and to the gate of transistor Q22. The drain of transistor Q22 is coupled to the voltage source VDD1. The source of transistor Q22 is coupled to the drain of transistor Q21. The source of transistor Q21 is coupled to the source of transistor Q20 and to a voltage source VSS1, as shown.

In one specific embodiment, the voltages VDD1 and VSS1 are +2.5 volts and −6 volts, respectively, the resistor R12 is 53.4 ohms, and the gate area of transistor Q20 is on the order of 100 micrometer ($um^2$) while the gate areas of transistors Q21 and Q22 are on the order of 300 micrometer ($um^2$).

It will be understood that any suitable transistors may be utilized for transistors Q20, Q21 ands Q22 to implement the pre-driver circuit 708 having the characteristics and functionality as contemplated and described herein. In one embodiment, transistors Q20-Q22 are gallium nitride (GaN), pseudomorphic high electronic mobility transistors (pHEMT), or a combination of these. Other types of transistors may be used.

The driver 710 (only the signal A path is shown) receives the output signal (PDOUTA) from the pre-driver 708 as its input to the gates of transistors Q23 and Q24, as shown. The drain of transistor Q23 is coupled through resistor R13 to a voltage source VDD2 and to the gate of transistor Q25. The drain of transistor Q25 is coupled to the voltage source VDD2. The source of transistor Q25 is coupled to the drain of transistor Q24. The source of transistor Q24 is coupled to the source of transistor Q23 and to a voltage source VSS2, as shown. This transistor configuration is similar to the pre-driver configuration.

In one specific embodiment, the resistor R12 is 20 ohms, the voltages VDD2 and VSS2 are +0.5 volts and −3 volts, respectively, and the gate area of transistor Q23 is on the order of 300 micrometer ($um^2$) while the gate areas of transistors Q24 and Q25 are on the order of 1 millimeter ($mm^2$).

It will be understood that any suitable transistors may be utilized for transistors Q23, Q24 and Q25 to implement the pre-driver circuit 710 having the characteristics and functionality as contemplated and described herein. In one embodiment, transistors Q23-Q25 are gallium nitride (GaN), pseudomorphic high electronic mobility transistors (pHEMT), or a combination of these. Other types of transistors may be used. This configuration may provide benefits when enhancement type FET or BJT transistors are utilized As will be appreciated, the transistor sizes in the output stage of the driver 710 are about 3× or greater than the transistor sizes in the output stage of the pre-driver 708, which provides for increasing power driving/switching capability.

Though the embodiments for the DPA 104 described herein are shown utilizing differential digital signals, a person of skill in the art may be able to utilize the teachings and concept described herein within a single-ended implementation. In addition, if a multi-phase implementation, multiple DPAs 102 may be used in the digital transmitter 100.

The transistors (or the transistors and some or all of the circuit elements) of the differential amplifier 206, pre-driver 208, 708 and the driver 210, 710 may be implemented using discrete elements, or may be integrated in a single integrated semiconductor circuit, such as a monolithic microwave integrated circuit (MMIC). Further, the power transistors Q1 and Q2 of the output stage 204 may also be implemented as discrete elements or may be included with the other aforementioned components in a single integrated semiconductor circuit, such as a MMIC.

RF Communications Network

Figure 8:
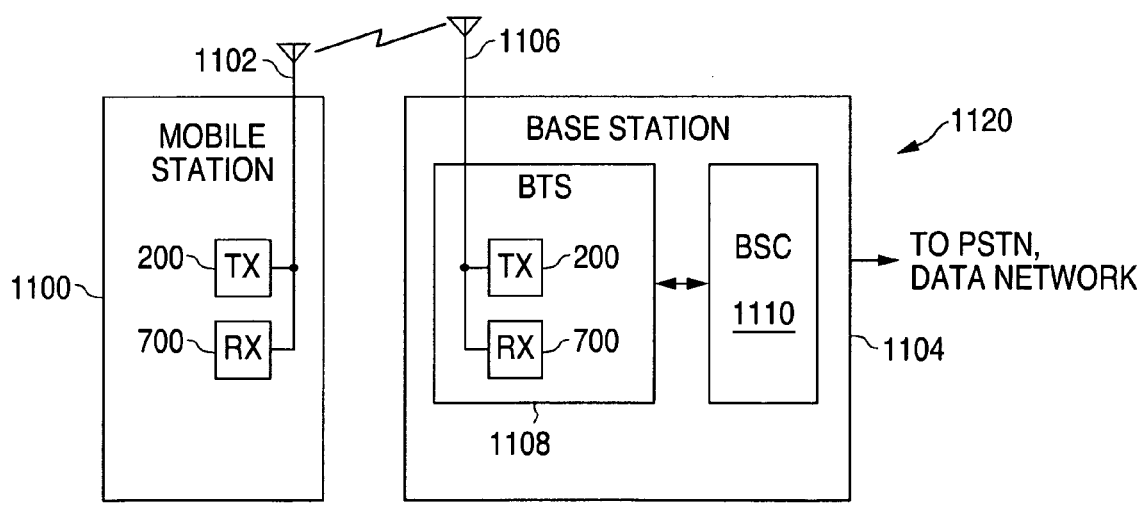
FIG. 8 illustrates an exemplary wireless communications network, including communication devices incorporating the transmitter described in the present disclosure.

Now referring to FIG. 8, there is illustrated a block diagram of an exemplary wireless communications network 1120. The wireless communications network 1120 includes a first wireless communications device 1100 and a second wireless communications device 1104. The first wireless communications device 1100 is shown including the transmitter 100 as described above and in accordance with the present invention. Similarly, the second wireless communications device 1104 includes the transmitter 100 as described above and in accordance with the present invention. It will be understood it is not necessary for both of the devices 1100 and 1104 to include the transmitter 100—either one or both may include the transmitter 100.

The two communications devices 1100 and 1104 communicate via RF signals utilizing an antenna 1102 and an antenna 1106, respectively, as shown.

The exemplary wireless communications network 1120 may operate in accordance with one or more wireless protocols or technologies, such as CDMA, TDMA, FDMA, UMTS, etc. (and versions thereof). Further, the network 1120 may support circuit-switched, and packet-switched or packet data communications.

In the embodiment in FIG. 8, the first communications device 1100 is illustrated as a mobile station or mobile terminal (or possibly fixed), such as a wireless handset, while the second communications device 1104 is illustrated as a base station, though not limited to such embodiment. The devices 1100, 1104 may be any device having wireless communications capabilities. As shown, the base station 1104 includes a base transceiver subsystem (BTS) 1108 that includes the transmitter 100. The BTS 1108 is connected to a base station controller (BSC) 1110. Collectively, the BTS 1108 and the BSC 1110 are logically referred to as the "base station" 1104. Multiple BTS 1108 sometimes share one BSC 1110. The BSC 1110 manages resource allocation among the several BTSs. More generally, the terms "base station" and "access network" refer to any entity (or collection of entities) that communicates wirelessly with mobile stations for communications sessions (e.g., circuit-switched or packet-switched). The base station 1104 is coupled to the public switched telephone network (PSTN) or other data or switched network. This path may include additional elements such as a mobile switching center (MSC) (not shown) coupled to the BSC 1110.

In some embodiments, some or all of the functions or processes of the one or more of the devices are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A digital power amplifier comprising:
a differential amplifier adapted to receive and amplify a first digital modulated signal and a second digital modulated signal and generate a third digital modulated signal, the second digital modulated signal 180 degrees out of phase with the first digital modulated signal;
a pre-driver adapted to receive the third digital modulated signal and generate a pre-drive signal;
a driver coupled to the pre-driver and adapted to receive the pre-drive signal and generate a drive signal;
a power amplifier coupled to the driver and having at least one power transistor adapted to receive the drive signal and generate a power amplified digital signal for RF transmission via an antenna; and
wherein the pre-driver, driver and power amplifier collectively amplify the third digital modulated signal.

2. The digital power amplifier in accordance with claim 1 wherein the driver has an output impedance of about 5 ohms or less.

3. The digital power amplifier in accordance with claim 1 wherein the pre-driver comprises at least one transistor having a given output power driving capability and the driver comprises at least one transistor having a given output power driving capability greater than the output power driving capability of the pre-driver.

4. The digital power amplifier in accordance with claim 3 wherein the at least one transistor of the pre-driver and the at least one transistor of the driver are gallium nitride (GaN) transistors.

5. The digital power amplifier in accordance with claim 3 wherein the at least one transistor of the pre-driver and the at least one transistor of the driver are pseudomorphic high electronic mobility transistors (pHEMT).

6. The digital power amplifier in accordance with claim 1 wherein the pre-driver comprises a plurality of transistors having a given output power driving capability and the driver comprises a plurality of transistors having a given power driving capability greater than the output power driving capability of the pre-driver.

7. The digital power amplifier in accordance with claim 6 wherein the plurality of pre-driver transistors and the plurality of driver transistors are gallium nitride (GaN) transistors.

8. The digital power amplifier in accordance with claim 6 wherein the plurality of pre-driver transistors and the plurality of driver transistors are pseudomorphic high electronic mobility transistors (pHEMT).

9. The digital amplifier in accordance with claim 6 wherein the power amplifier is configured as a current mode class-D push-pull amplifier.

10. A digital power amplifier comprising:
a differential amplifier having two input terminals for receiving a first low voltage digital modulated signal and a second low voltage digital modulated signal and having two output terminals for outputting a first differential amplified digital modulated signal and a second differential amplified digital modulated signal;
a low impedance pre-driver circuit having two input terminals coupled to the two differential amplifier output terminals and having four output terminals for outputting a first pre-driver output signal, a second pre-driver output signal, a third pre-driver output signal and a fourth pre-driver output signal;
a low impedance driver having four input terminals respectively coupled to the four pre-driver output terminals and having two output terminals for outputting a first drive signal and a second drive signal;
a power amplifier comprising,
a first power transistor having a gate, a first source/drain and a second source/drain, the second source/drain coupled to a first voltage source VSS,
a second power transistor having a gate, a first source/drain and a second source/drain, the second source/drain coupled to the first voltage source VSS,
a first inductive element coupled to a second voltage source VDD and coupled to the first source/drain of the first power transistor, and
a second inductive element coupled to the second voltage source VDD and coupled to the first source/drain of the second power transistor; and
wherein the first source/drain of the first power transistor outputs an amplified version of the first digital modulated signal and the second source/drain of the second power transistor outputs an amplified version of the second digital modulated signal.

11. The digital power amplifier in accordance with claim 10 wherein the power amplifier is configured as a current mode class-D push-pull amplifier.

12. The digital power amplifier in accordance with claim 11 wherein the driver has an output impedance of about 5 ohms or less.

13. The digital power amplifier in accordance with claim 12 wherein the pre-driver comprises a plurality of transistors having a gate size X and the driver comprises a plurality of transistors having a gate size at least about 3×.

14. The digital power amplifier in accordance with claim 13 wherein the plurality of pre-driver transistors and the plurality of driver transistors are gallium nitride (GaN) transistors.

15. The digital power amplifier in accordance with claim 13 wherein the plurality of pre-driver transistors and the plurality of driver transistors are pseudomorphic high electronic mobility transistors (pHEMT).

16. A wireless communications device, comprising:
a digital transmitter comprising,
a digital upconverter adapted to generate a digital modulated signal, wherein the digital modulated signal comprises a first digital modulated signal and a second digital modulated signal, the second digital modulated signal 180 degrees out of phase with the first digital modulated signal; and
a digital power amplifier comprising,
a differential amplifier adapted to receive the first digital modulated signal and the second digital modulated signal and generate a differential pre-drive signal:
a pre-driver adapted to receive the differential pre-drive signal and generate a pre-drive signal,
a driver coupled to the pre-driver and adapted to receive the pre-drive signal and generate a drive signal,
a power amplifier coupled to the driver and having at least one power transistor adapted to receive the drive signal and generate a power amplified digital signal for RF transmission, and
wherein the pre-driver, driver and power amplifier collectively amplify the digital modulated signal; and
an antenna coupled to the digital power amplifier for transmitting the power amplified digital signal.

17. The wireless communication device in accordance with claim 16 wherein the pre-driver comprises a plurality of transistors having a gate size X and the driver comprises a plurality of transistors having a gate size at least about 3×

18. The wireless communication device in accordance with claim 17 wherein each of the plurality of pre-driver transistors and each of the plurality of driver transistors are a one of gallium nitride (GaN) transistor and pseudomorphic high electronic mobility transistor (pHEMT).

* * * * *